US008174858B2

(12) United States Patent
Janzen et al.

(10) Patent No.: US 8,174,858 B2
(45) Date of Patent: *May 8, 2012

(54) TECHNIQUES FOR IMPLEMENTING ACCURATE DEVICE PARAMETERS STORED IN A DATABASE

(75) Inventors: Jeffery W. Janzen, Meridian, ID (US); Scott Schaefer, Boise, ID (US); Todd D. Farrell, Boise, ID (US)

(73) Assignee: Round Rock Research, LLC, Mt. Kisco, NY (US)

(*) Notice: Subject to any disclaimer, the term of this patent is extended or adjusted under 35 U.S.C. 154(b) by 186 days.

This patent is subject to a terminal disclaimer.

(21) Appl. No.: 12/690,790

(22) Filed: Jan. 20, 2010

(65) Prior Publication Data

US 2010/0122061 A1 May 13, 2010

Related U.S. Application Data

(60) Continuation of application No. 12/013,266, filed on Jan. 11, 2008, now Pat. No. 7,663,901, which is a continuation of application No. 11/211,940, filed on Aug. 24, 2005, now Pat. No. 7,333,355, which is a division of application No. 10/816,241, filed on Apr. 1, 2004, now Pat. No. 7,120,065.

(51) Int. Cl.
*G11C 5/02* (2006.01)
(52) U.S. Cl. .......................... 365/51; 365/52; 365/185.08
(58) Field of Classification Search ................ 365/51, 365/52, 185.08
See application file for complete search history.

(56) References Cited

U.S. PATENT DOCUMENTS

| 5,189,641 | A | 2/1993 | Arakawa |
| 5,432,742 | A | 7/1995 | Ihara et al. |
| 5,995,405 | A | 11/1999 | Trick |
| 6,314,044 | B1 | 11/2001 | Sasaki et al. |
| 6,336,174 | B1 * | 1/2002 | Li et al. .................... 711/162 |
| 6,392,912 | B1 | 5/2002 | Hanrahan et al. |
| 6,842,369 | B2 | 1/2005 | Koll et al. |
| 6,850,446 | B1 | 2/2005 | Raszka et al. |
| 6,880,075 | B1 | 4/2005 | Fukano et al. |
| 6,947,303 | B2 | 9/2005 | Schnell |
| 7,006,392 | B2 | 2/2006 | Parekh |
| 7,035,159 | B2 * | 4/2006 | Janzen et al. ............ 365/225.7 |
| 7,065,994 | B1 | 6/2006 | Danko et al. |
| 7,085,152 | B2 * | 8/2006 | Ellis et al. .................... 365/149 |
| 7,120,065 | B2 * | 10/2006 | Janzen et al. ............ 365/189.15 |
| 7,228,469 | B2 | 6/2007 | Ito |
| 7,251,181 | B2 | 7/2007 | Janzen et al. |
| 7,281,079 | B2 | 10/2007 | Bains et al. |
| 7,308,524 | B2 | 12/2007 | Grundy et al. |
| 7,333,355 | B2 * | 2/2008 | Janzen et al. .................... 365/51 |
| 7,333,384 | B2 | 2/2008 | Janzen et al. |
| 7,363,422 | B2 | 4/2008 | Perego et al. |
| 7,480,792 | B2 | 1/2009 | Janzen et al. |
| 7,483,315 | B2 * | 1/2009 | Janzen et al. ............ 365/189.07 |
| 7,499,362 | B2 | 3/2009 | Janzen et al. |
| 7,663,901 | B2 * | 2/2010 | Janzen et al. .................... 365/51 |
| 2002/0016897 | A1 | 2/2002 | Nerl |
| 2002/0056063 | A1 | 5/2002 | Nerl |
| 2004/0078454 | A1 | 4/2004 | Abrahams et al. |
| 2006/0149996 | A1 | 7/2006 | Janzen et al. |
| 2006/0265615 | A1 | 11/2006 | Janzen et al. |

* cited by examiner

*Primary Examiner* — Pho M Luu
(74) *Attorney, Agent, or Firm* — Lerner, David, Littenberg, Krumholz & Mentlik, LLP

(57) ABSTRACT

Systems, memory modules and methods of configuring systems including memory modules are provided. The memory modules include device parameters specifically corresponding to memory devices of the memory module. The device parameters may be retrieved from a database, and the system may be configured in accordance with the device parameters retrieved from the database.

54 Claims, 4 Drawing Sheets

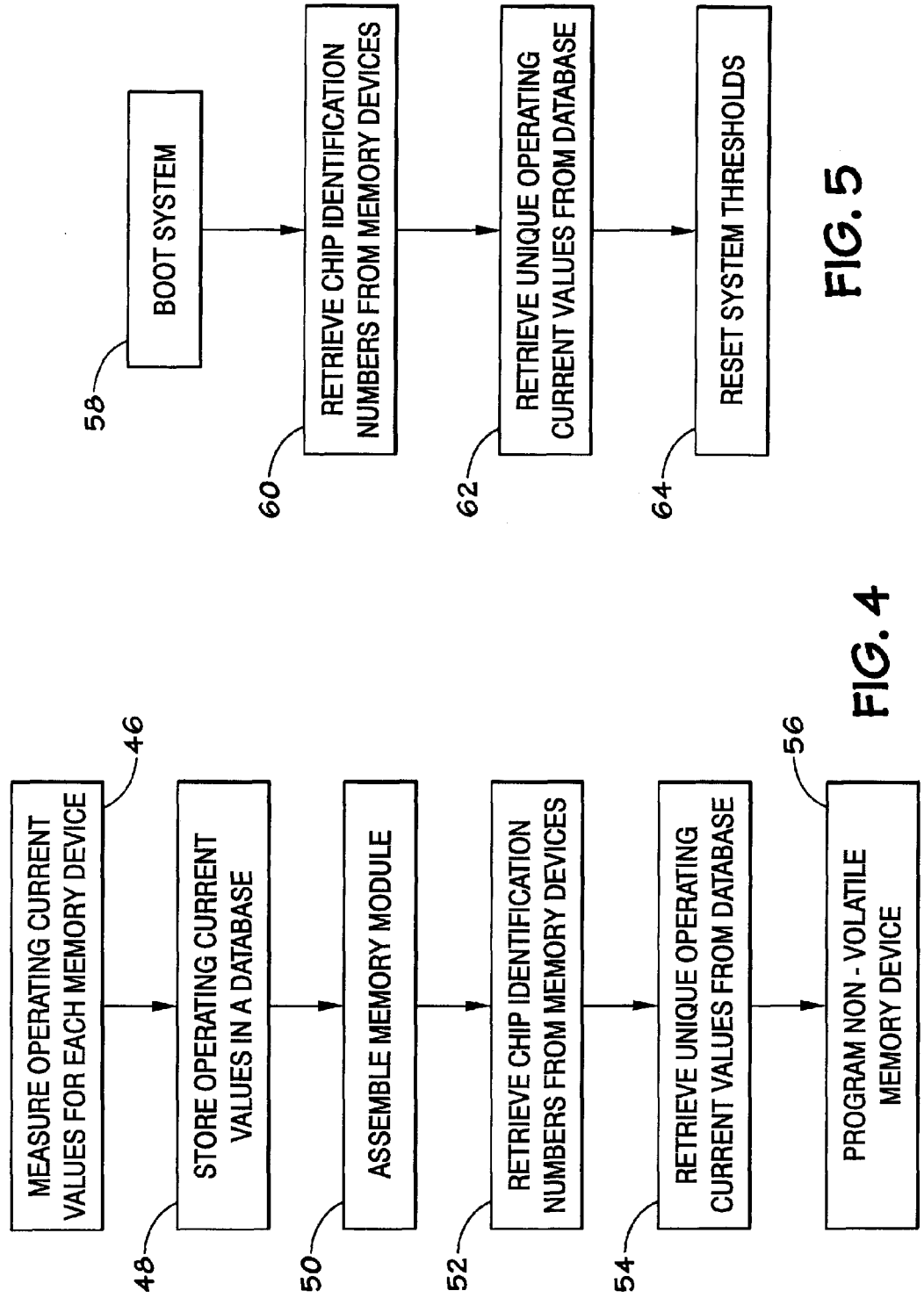

TECHNIQUES FOR IMPLEMENTING ACCURATE DEVICE PARAMETERS STORED IN A DATABASE

CROSS-REFERENCE TO RELATED APPLICATIONS

This application is a continuation of U.S. application Ser. No. 12/013,266, filed on Jan. 11, 2008, now U.S. Pat. No. 7,663,901, which is a continuation of U.S. application Ser. No. 11/211,940, filed on Aug. 24, 2005, now U.S. Pat. No. 7,333,355, which is a divisional of U.S. application Ser. No. 10/816,241, filed on Apr. 1, 2004, now U.S. Pat. No. 7,120,065.

BACKGROUND OF THE INVENTION

1. Field of the Invention

The present invention relates generally to memory subsystems and, more specifically, to a technique for implementing device-specific operating current values by accessing a database.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

In today's complex computer systems, speed, flexibility, and reliability in timing and control are issues typically considered by design engineers tasked with meeting customer requirements while implementing innovations which are constantly being developed for computer systems and their components. As system technology advances and processing and data access speeds continue to increase, design engineers are faced with a variety of ever-changing design challenges.

Computer systems generally include one or more central processing units (CPUs), such as microprocessors, which generally control system functions and facilitate the processing of system requests. The CPU(s) is coupled to the system memory which generally includes volatile memory, such as random access memory (RAM). The system memory may be implemented to store programs and data which may be accessible to other system components, such as processors or peripheral devices, while the computer system is powered-on. Typically, the memory devices in the system memory are grouped together to form memory modules, such as dual-inline memory modules, where the memory devices are electrically coupled together through one or more buses on the memory module. Computer systems may incorporate numerous memory modules to increase the storage capacity of the system.

The computer system may also include a segment of non-volatile memory, such as read-only memory (ROM), which may store the basic input/output system (BIOS). The system BIOS may be implemented to load the operating system into the system memory, and and to generally configure the system in accordance with the current system resources and topology.

Typically, computer device manufacturers design system devices, such as processors and memory devices, to operate correctly within a predetermined temperature range. If the temperature exceeds the predetermined range (i.e., the device becomes too hot), the device may not function properly (if at all), thereby potentially degrading the overall performance of the computer system. Thus, it is desirable for a computer system and its components to operate within a thermally benign environment.

However, the electrical devices of the computer system, such as the processors and memory devices, draw electrical current to perform their intended functions. Typically, any electrical device through which electrical current flows produces heat. The amount of heat that any one device generates is generally a function of the amount of current flowing through the device. Typically, the faster an electrical component is operating, the more heat that is produced by the component. Accordingly, with the increased processing speeds and data access rates of today's computer systems, component heat production may become more of a consideration in system designs. This may be particularly true for memory devices.

One technique for cooling memory devices may be referred to as "passive" cooling or system "throttling." Throttling refers to reducing the operating speed of a component so that less current flows through the component such that the component produces less heat. produces less heat. Accordingly, systems may be equipped with monitoring devices that are configured to monitor the temperature of system components, such as memory devices. If a memory device exceeds a threshold temperature, the access rate to that particular memory device may be reduced, for instance. Disadvantageously, implementing thermal monitoring devices on each system component may be difficult and expensive.

Accordingly, memory devices may be accompanied by data sheets that include operating currents for the devices operating in various modes and over various environmental conditions. The operating currents ($I_{DD}$) provide general ranges that may be implemented to set thresholds in the system, such that the devices may be monitored to ensure that they do not exceed the recommended operating currents. As can be appreciated, the operating currents may be correlated with the processing/access speed of the memory device. By setting thresholds based on operating currents provided in the data sheets, the system may be configured to reduce the access rate, and thereby reduce the operating current to mitigate the potential for the memory device becoming too hot.

Because data sheets are generally correlated with a particular type of memory chip, the operating currents provided on the data sheets generally account for the worst case scenarios. That is to say that data sheets include operating currents that are limited by those devices with the fastest failure rate. In practice, many of the memory devices can operate at currents of 15-40% outside of those provided on the data sheets. Accordingly, by configuring a computer system to reduce access rates based on operating currents currents provided on the data sheets, the memory devices are not being implemented to the full extent of their capabilities.

The present invention may address one or more of the problems set forth above.

BRIEF DESCRIPTION OF THE DRAWINGS

Advantages of the invention may become apparent upon reading the following detailed description and upon reference to the drawings in which:

FIG. 4 is a flow chart illustrating exemplary methods for fabricating memory modules in accordance with embodiments of the present invention; and FIG. 5 is a flow chart illustrating exemplary methods for configuring a system incorporating modules in accordance with embodiments of the present invention.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
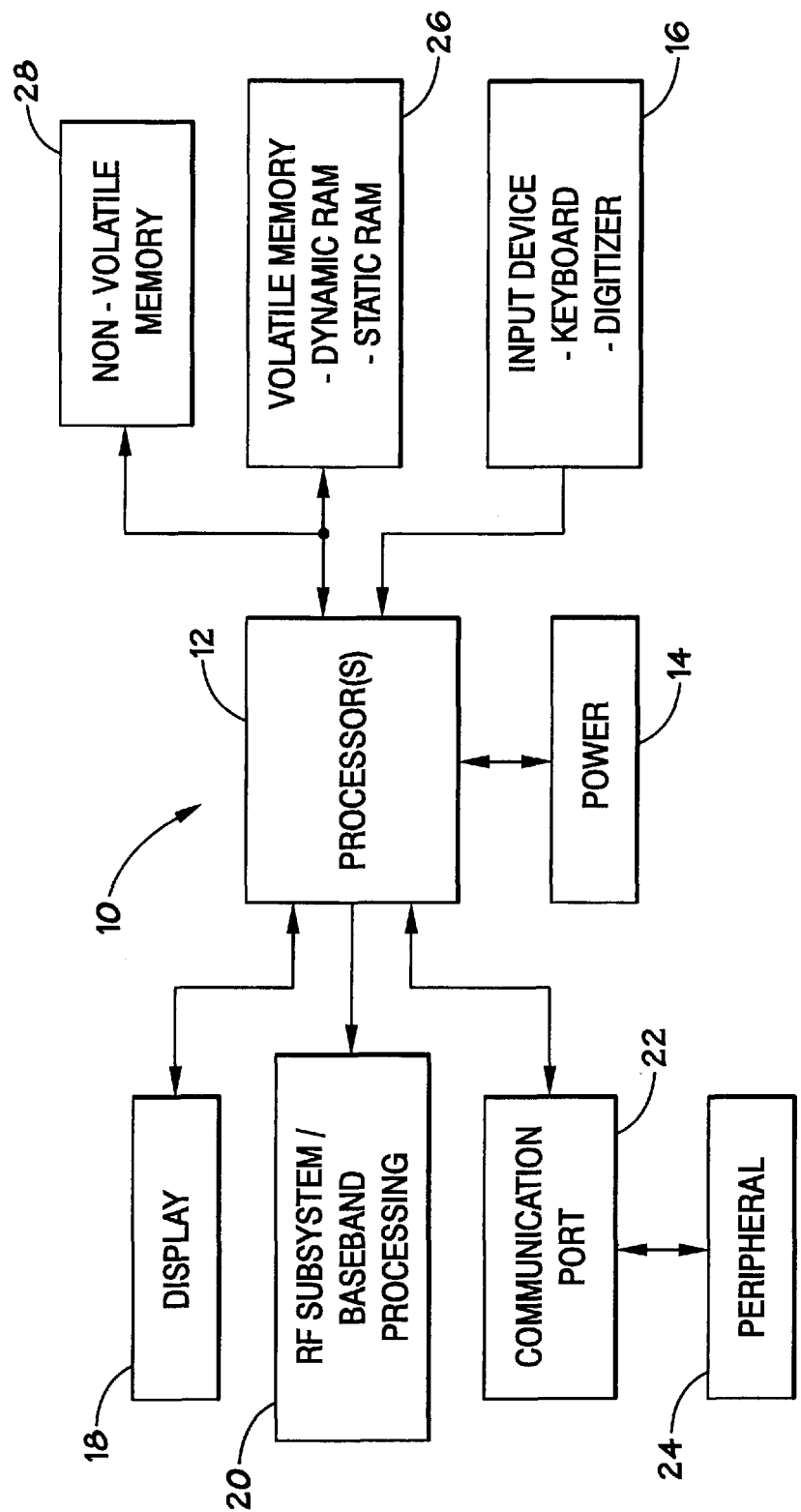
FIG. 1 illustrates a block diagram of an exemplary processor-based device in accordance with embodiments of the present invention.

Turning now to the drawings, and referring initially to FIG. 1, a block diagram depicting an exemplary processor-based system, generally designated by reference numeral 10, is illustrated. The system 10 may be any of a variety of types such as a computer, pager, cellular phone, personal organizer, control circuit, etc. In a typical processor-based device, one or more processors 12, such as a microprocessor, controls the processing of system functions and requests in the system 10. As will be appreciated, the processor 12 processor 12 may include an embedded North or South bridge, for coupling each of the aforementioned components thereto. Alternatively, the bridges (not shown) may include separate bridges coupled between the processor 12 and the various components of the system 10.

The system 10 typically includes a power supply 14. For instance, if the system 10 is a portable system, the power supply 14 may advantageously include permanent batteries, replaceable batteries, and/or rechargeable batteries. The power supply 14 may also include an AC adapter, so the system 10 may be plugged into a wall outlet, for instance. The power supply 14 may also include a DC adapter such that the system 10 may be plugged into a vehicle cigarette lighter, for instance. Various other devices may be coupled to the processor 12 depending on the functions that the system 10 performs. For instance, a user interface 16 may be coupled to the processor 12. The user interface 16 may include buttons, switches, a keyboard, a light pen, a mouse, and/or a voice recognition system, for instance. A display 18 may also be coupled to the processor 12. The display 18 may include an LCD display, a CRT, LEDs, and/or an audio display, for example. Furthermore, an RF sub-system/baseband processor 20 may also be coupled to the processor 12. The RF sub-system/baseband processor 20 may include an antenna that is coupled to an RF receiver and to an RF transmitter (not shown). One or more communication ports 22 may also be coupled to the processor 12. The communication port 22 may be adapted to be coupled to one or more peripheral devices 24 such as a modem, a printer, a computer, or to a network, such as a local area network, remote area network, intranet, or the Internet, for instance.

Because the processor 12 generally controls the functioning of the system 10 by implementing software programs, the memory is operabley coupled to the processor 12 to store and facilitate execution of various programs. For instance, the processor 12 may be coupled to the volatile memory 26 which may include Dynamic Random Access Memory (DRAM) and/or Static Random Access Memory (SRAM). The volatile memory 26 may include a number of memory modules, as described further below. As can be appreciated, the volatile memory 26 may simply be referred to as the "system memory." The volatile memory 26 is typically quite large so that it can store dynamically loaded applications and data.

The processor 12 may also be coupled to non-volatile memory 28. The non-volatile memory 28 may include a read-only memory (ROM), such as an EPROM, and/or flash memory to be used in conjunction with the volatile memory. The size of the ROM is typically selected to be just large enough to store any necessary operating system, application programs, and fixed data. Additionally, the non-volatile memory 28 may include a high capacity memory such as a tape or disk drive memory.

Figure 2:
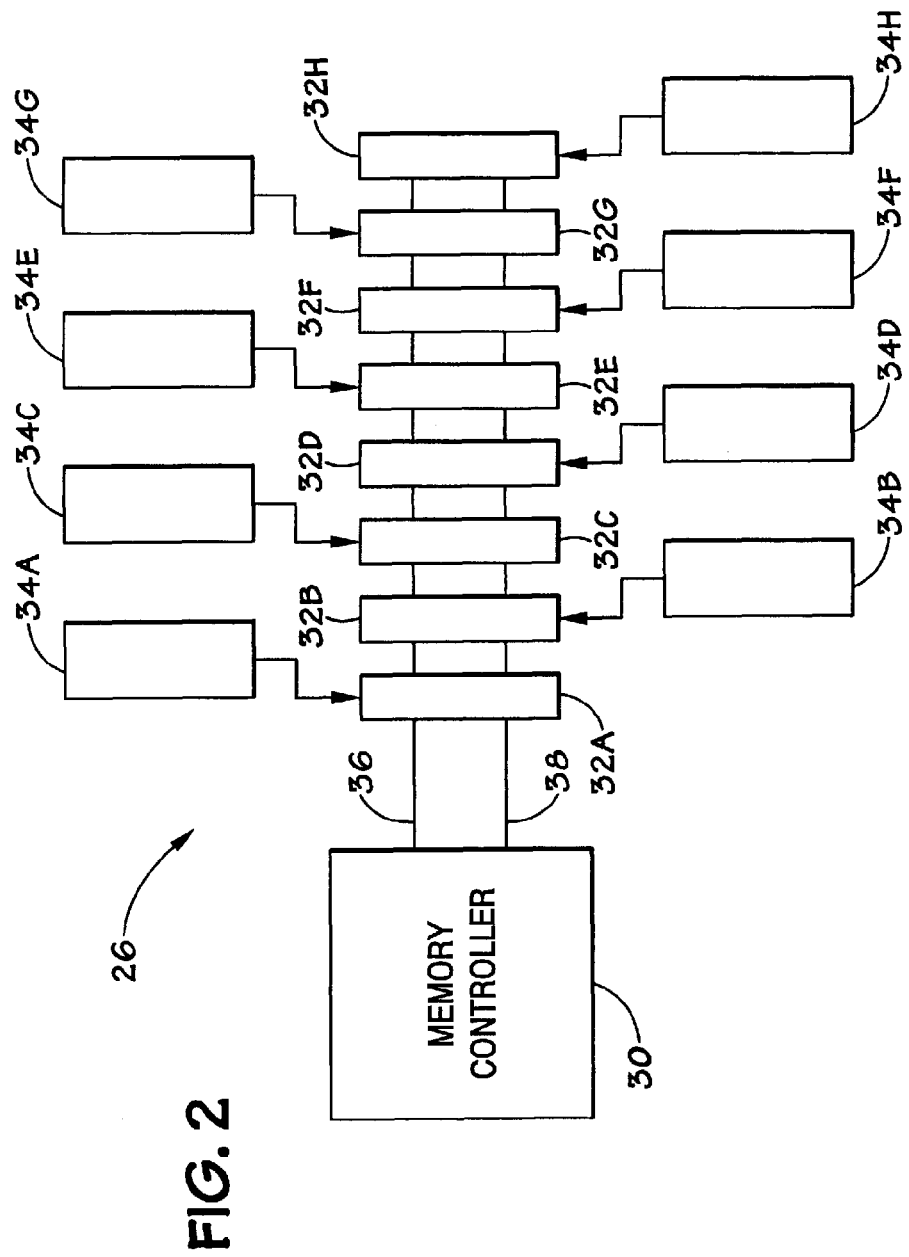
FIG. 2 illustrates an exemplary memory sub-system in accordance with embodiments of the present invention.

FIG. 2 generally illustrates a block diagram of a portion of a memory sub-system, such as the volatile memory 26. A memory controller 30 is generally provided to facilitate access to the storage devices in the system memory 26. While the present embodiment illustrates the memory controller 30 as existing in the memory sub-system, the memory controller 30 may be in the processor 12 or may exist in a discrete chip, as can be can be appreciated by those skilled in the art. The memory controller 30 may receive requests to access the memory devices via one or more processors, such as the processor 12, via peripheral devices, such as the peripheral device 24, and/or via other systems. The memory controller 30 is generally tasked with facilitating the execution of the requests to the memory devices and coordinating the exchange of information, including configuration information, to and from the memory devices.

The volatile memory 26 may include one or more connectors or slots 32A-32H that are each configured to operably couple a respective memory module 34A-34H, such as a dual-inline memory module (DIMM), to the memory controller 30 via one or more memory buses. Each memory module 34A-34H generally includes one or more memory devices such as dynamic random access memory (DRAM) devices capable of storing data. The memory buses may include a data bus 36 to facilitate the exchange of data between each memory device and the memory controller 30. The data bus 36 may comprise a plurality of single bit data buses each coupled from the memory controller 30 to an individual memory device. In one exemplary embodiment of the volatile memory 26, the memory data bus 36 may include 64 individual data buses. In other words, the exemplary data bus 36 may have a width of 64 bits. In this exemplary embodiment, each of the eight memory slots 32A-32H is capable of supporting a memory module 34 comprising eight memory devices. Further, the data bus 36 may include one or more individual buses to each memory slot 32A-32H which may be used for ECC error detection and correction. Further, one or more of the devices on the memory modules 34A-34E may be implemented for parity data storage. As can be appreciated by those skilled in the art, aspects of the data skilled in the art, aspects of the data bus 36 will vary depending on the configuration and capabilities of the system 10.

The volatile memory 26 may also include a command bus 38 on which address information such as command address (CA), row address select (RAS), column address select (CAS), write enable (WE), bank address (BA), and chip select (CS), for example, may be delivered for a corresponding request. Further, the command bus 38 may also be used to facilitate the exchange of configuration information at system boot. As with the data bus 36, the command bus 38 may comprise a plurality of individual command buses. In the present exemplary embodiment, the command bus may include 20 individual buses, for instance. Accordingly, the present exemplary command bus may have a width of 20 bits. As previously explained with reference to the data bus 36, a variety of embodiments may be implemented for the command bus 38 depending on the system configuration.

Figure 3:
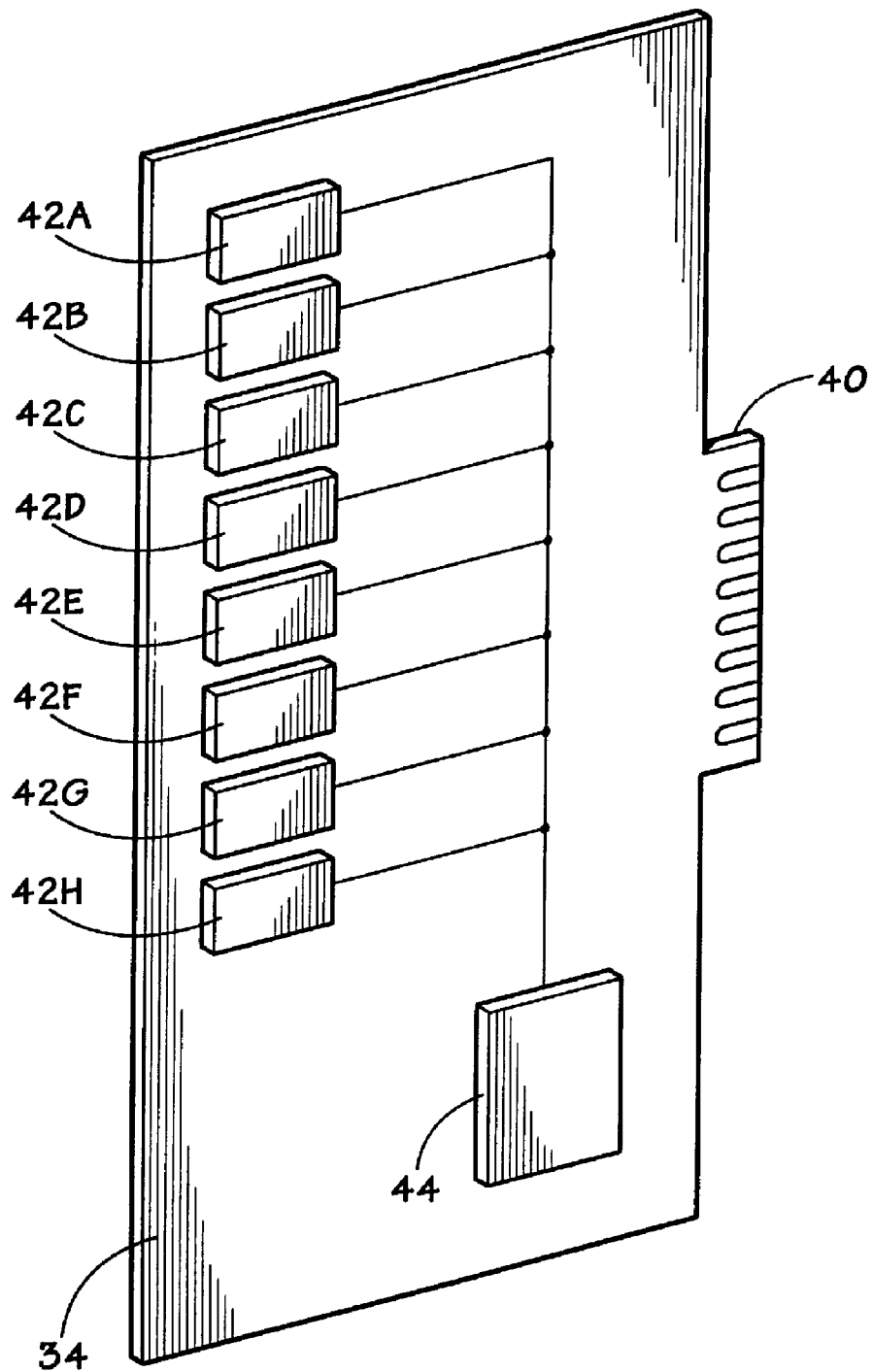
FIG. 3 illustrates an exemplary memory module in accordance with embodiments of the present invention.

FIG. 3 illustrates an exemplary memory module 34, such as a DIMM, that may be inserted into one of the memory slots 32A-32H (FIG. 2). The memory module 34 may include an edge connector 40 to facilitate mechanical coupling of the memory module 34 into a memory slot 32A-32H. Further, the edge connector 40 provides a mechanism for facilitating the exchange of data and control signals from the memory controller 30 (FIG. 2) to devices on the memory module 34. The memory module 34 may include a plurality of volatile memory devices 42A-42H, such as dynamic random access memory devices (DRAMs), which may be used for storing information. Alternatively, rather than an edge connector 40, the memory module 34 may include another type of contact means, such as a connector generally located in an area of the memory module 34 other than edge (e.g., center).

Each memory module 34 may also include a non-volatile memory device 44 to store information corresponding to the respective memory module 34 and memory devices 42A-42H on the memory module 34, such as device size, speed, operating voltages and timing parameters, for instance. The non-volatile memory device 44 on each memory module 34 may be accessed by the Basic Input/Output System (BIOS) at system boot to properly configure the system to fit the particular performance profiles of the memory devices 42A-42H on the corresponding memory module 34. One such non-volatile memory device 44 is a serial presence detect (SPD). An SPD device is typically an eight-pin, non-volatile, read only, serial chip which stores information about the memory module 34 including, but not limited to, the module size, speed, voltage, drive strength, and the number of row and column addresses. At system boot, the system BIOS reads the parameters stored on the SPD and automatically configures the system chipset to maximize reliability and system performance. If timing parameters are not adjusted during the system boot, the system 10 may produce more errors and/or operate at non-optimal speeds.

Generally speaking, memory devices, such as the memory devices 42A-42H, are tested and characterized such that a system 10 in which the memory devices 42A-42H are implemented may be configured to operate optimally within particular ranges for particular instructions and over a specified range of conditions. One parameter that may be tested is be tested is operating current. As previously described, operating current parameters or values are generally provided on data sheets, such that a system may be configured to operate within the operating current parameters. Operating current parameters may be provided for a number of conditions. Optimal operating current parameters may be derived from testing a number of memory devices over a range of operating conditions. As previously described, the faster the memory device is accessed, the higher the operating current and the more likely that the functionality of the memory device will fail due to the high temperature of the memory device caused by the high operating speeds. Accordingly, operating current parameters in data sheets can function as guidelines for optimizing the functionality of the memory device 42A-42H, and a system 10 may be configured to operate such that the maximum operating current parameters are not exceeded during operation of the system 10.

Operating current parameters are generally provided for a particular type of memory device, such as a dynamic random access memory (DRAM) device, a static random access memory (SRAM), a synchronous dynamic random access memory (SDRAM) device or a double data rate synchronous dynamic random access memory (DDR SDRAM) device, for example. To ensure that a large majority of the memory devices 42A-42H function properly within the ascribed operating currents, the operating current parameters provided on the data sheets generally provide worst-case current values. While this may ensure that the majority of the memory devices 42A-42H will function properly (i.e., will not exceed recommended operating temperatures), it does not ensure that the memory devices 42A-42H are operating optimally, because the operating current current parameters are generally set in accordance with the memory devices 42A-42H having the lowest acceptable test performance. By providing specific operating current values for the particular memory devices 42A-42H being implemented in the system 10, in accordance with the present embodiments, system performance may be optimized for the particular memory devices 42A-42H being implemented, as described further below.

In accordance with embodiments of the present techniques, memory devices, such as the memory devices 42A-42H, may be individually tested such that device-specific operating current ($I_{DD}$) values uniquely corresponding to each memory device 42A-42H can be recorded and stored in a database. In one embodiment, the operating current values in the database may be used during fabrication of a memory module 34 wherein the database is accessed during fabrication and a non-volatile memory device 44 may be uniquely programmed in accordance with the specific operating current values for the particular memory devices 42A-42H on the memory module 34. After fabrication and programming of the non-volatile memory device 44, a memory module 34 can be shipped for implementation in a system and the operating current values may be accessed by the system 10 from the non-volatile memory device 44 such that the system 10 can be configured to operate optimally within the capabilities of the particular memory devices 42A-42H. This method of fabrication is described further below.

Referring now to FIG. 4, exemplary methods for fabricating a memory module 34 in accordance with one embodiment of the present invention is illustrated. After manufacturing of the memory devices 42A-42H, operating current ($I_{DD}$) values for each of of the memory devices 42A-42H may be measured, as indicated in block 46. After testing each memory device 42A-42H, any desirable number of operating current values for each memory device 42A-42H may be stored in a database, as indicated in block 48. In one exemplary embodiment, the operating current values for a particular memory device 42A-42H may be stored in accordance with the chip identification number for the corresponding memory device 42A-42H, as can be appreciated as those skilled in the art.

Once the memory devices 42A-42H are measured and the operating current values are stored in the database, the memory module 34 can be assembled, as indicated in block 50. As can be appreciated, each of the memory devices 42A-42H and the non-volatile memory device 44, such as a serial presence detect, may be electrically and mechanically coupled to a substrate to form the memory module 34. Once the memory module 34 is assembled, the memory module 34 may be inserted into a testing/diagnostic system at fabrication, such that the memory devices 42A-42H can be accessed.

The memory devices 42A-42H may be accessed such that the unique chip identification number for each of the corresponding memory devices 42A-42H may be retrieved, as indicated in block 52. While the present exemplary embodiment implements a chip identification number to uniquely identify a particular memory device 42A-42H, any other mechanism for uniquely identifying the memory device 42A-42H may be implemented.

Once the chip identification number is retrieved, the database may be accessed to retrieve the specific operating current values corresponding to each of the unique chip identification numbers (and memory devices 42A-42H), as illustrated in block 54. In one exemplary embodiment, the database may be accessed via the Internet. The operating current information may be provided over a secured or unsecured channel, for instance. Alternatively, the database may be accessed via an internal intranet or a local area network (LAN). Still further, the operating current values may be stored on a transportable medium or database such as a compact disk (CD), for instance. Regardless of the location of the database and the means of accessing the database, the database provides device specific operating current values that may be programmed into the non-volatile memory device 44, as indicated in block 56. As previously described, by storing device specific operating current values on each memory module 34, the device specific operating current values may be implemented to optimize the system in which the memory module 34 is incorporated.

While the present exemplary embodiments illustrate the advantages of measuring and storing device specific operating current values in a database, other parameters, such as voltage or timing parameters, may also be measured on a particular memory device 42A-42H and advantageously stored in the database. As described above with regard to the operating currents, any parameters for a specific memory device 42A-42H may be measured and stored in the database from later use, such as for programming the non-volatile memory device 44 (block 56). These parameters may be used to set thresholds and otherwise optimize performance of the memory device 42A-42H and the system 10 in general.

FIG. 5 illustrates an exemplary embodiment of the present techniques wherein the database containing the operating current values may not be accessed during fabrication of the memory module 34, but instead may be accessed during operation of the memory module 34 in a system 10. At startup, a system boot is implemented as indicated in block 58. Generally, the system 10 is booted to operate under nominal operating conditions. The memory devices 42A-42H are generally set to function at nominal operating currents in accordance with worst-case failure mechanisms. Accordingly, at system boot, the memory devices 42A-42H may not operate optimally within the capabilities of the particular memory devices 42A-42H.

To optimize the operation of the system 10, a processor 12 may access the memory module 34 to obtain the chip identification numbers for each of the memory devices 42A-42H. In one embodiment, the chip identification numbers may be stored in the non-volatile memory device 44, as previously described with reference to FIG. 4. Alternatively, the processor 12 may directly access each memory device 42A-42H to obtain the unique chip identification number corresponding to each particular memory device 42A-42H, as indicated in block 60. Once the unique chip identification number is retrieved, a database may be accessed to retrieve operating current values uniquely corresponding to the memory devices 42A-42H, as indicated in block 62. As discussed above, the database may be accessed over the Internet, for instance. Alternatively, each memory module or group of memory modules 34 that may be shipped for implementation into a system 10, may include a portable database such as a compact disk that may be implemented to retrieve the operating current values. The device specific operating current values retrieved from the current values retrieved from the database may implemented to reset the operating current thresholds in the system, as indicated in block 64. By resetting the operating current thresholds in the system 10, performance capabilities of the system 10 may be optimized.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A system comprising:
 a processor; and
 a memory module comprising a plurality of memory devices,
 wherein the system is configured to retrieve device parameters from a database and configure the system in accordance with the device parameters, and wherein the device parameters specifically correspond to the plurality of memory devices of the module.

2. The system of claim 1, wherein the system is further configured to retrieve a respective identification number for each of the memory devices.

3. The system of claim 2, wherein the processor is configured to access the memory module to obtain the identification numbers.

4. The system of claim 3, wherein the memory module further comprises a non-volatile memory device that is configured to store the identification numbers.

5. The system of claim 3, wherein the processor is configured to access each of the memory devices to obtain the identification numbers.

6. The system of claim 1, wherein the system is configured to access the database over the Internet.

7. The system of claim 1, wherein the database is stored on computer readable media corresponding to the memory module, wherein the computer readable media is configured to be accessed by the system.

8. The system of claim 7, wherein the computer readable media comprises a compact disk (CD).

9. The system of claim 1, wherein the device parameters comprise operating currents of the plurality of memory devices.

10. The system of claim 1, wherein the system is configured to reset an operating current threshold in the system.

11. The system of claim 1, wherein the system is configured to implement a system boot at startup.

12. The system of claim 1, wherein the system is configured to operate under nominal operating conditions responsive to booting.

13. The system of claim 11, wherein the system is configured to configure the system in accordance with the device parameters after the system boot.

14. The system of claim 11, wherein the system further comprises a Basic Input/Output System (BIOS) configured to read the parameters.

15. The system of claim 14, further comprising a chipset, wherein the BIOS is further configured to automatically configure the chipset.

16. The system of claim 1, wherein the system is configured to adjust timing parameters.

17. The system of claim 1, wherein the system is configured to operate such that maximum device parameters are not exceeded during operation of the system.

18. The system of claim 1, wherein the plurality of memory devices comprise a particular plurality of memory devices, and wherein the system is configured such that system performance is optimized for the particular plurality of memory devices.

19. The system of claim 1, wherein the device parameters comprise at least one of a device size, speed, operating voltage and/or timing parameter.

20. A method of configuring a system including a memory module comprising:
retrieving a device parameter from a database, wherein the device parameter corresponds to a specific memory device of the module; and
configuring the system in accordance with the retrieved device parameter.

21. The method of claim 20, further comprising measuring the device parameter.

22. The method of claim 21, wherein measuring the device parameter comprises measuring an operating current value of the specific memory device.

23. The method of claim 21, further comprising storing the device parameter in the database.

24. The method of claim 23, further comprising assembling the memory module after measuring the device parameter and storing the device parameter in the database.

25. The method of claim 20, wherein the device parameter is stored in the database in accordance with an identification number of the specific memory device.

26. The method of claim 25, further comprising retrieving the identification number of the specific memory device, wherein the identification number is used to retrieve the device parameter.

27. The method of claim 26, wherein retrieving the identification number of the specific memory device comprises accessing the specific memory device to retrieve the identification number.

28. The method of claim 26, wherein retrieving the identification number of the specific memory device comprises obtaining the identification number from a non-volatile memory device of the memory module.

29. The method of claim 20, wherein retrieving the device parameter comprises accessing the database via the Internet to retrieve the device parameter.

30. The method of claim 20, wherein retrieving the device parameter comprises receiving the device parameter over a secured channel.

31. The method of claim 20, wherein retrieving the device parameter comprises accessing the database via an internal intranet to retrieve the device parameter.

32. The method of claim 20, wherein retrieving the device parameter comprises accessing the database via a local area network (LAN) to retrieve the device parameter.

33. The method of claim 20, further comprising storing the database on a compact disk (CD).

34. The method of claim 20, further comprising storing the device parameter on the memory module.

35. The method of claim 34, wherein storing the device parameter on the memory module comprises programming the device parameter into a non-volatile memory device of the memory module.

36. The method of claim 20, wherein the device parameter comprises at least one of an operating current value, a voltage parameter and/or a timing parameter.

37. The method of claim 20, wherein configuring the system comprises using the device parameter to set a threshold of the memory device.

38. The method of claim 20, wherein retrieving the device parameter comprises accessing the database during fabrication of the memory module.

39. The method of claim 20, wherein retrieving the device parameter comprises accessing the database during operation of the memory module.

40. The method of claim 20, further comprising implementing a boot of the system prior to configuring the system.

41. The method of claim 20, further comprising booting the system to operate under nominal operating conditions prior to configuring the system.

42. The method of claim 41, wherein booting the system to operate under nominal operation conditions comprises setting the memory device to function at a nominal device parameter in accordance with a worst-case failure mechanism.

43. The method of claim 20, wherein configuring the system comprises resetting an operating current threshold in the system.

44. The method of claim 20, wherein configuring the system comprises configuring a chipset of the system.

45. The method of claim 20, wherein configuring the system comprises configuring the system to fit a performance profile of the specific memory device.

46. A memory module, comprising:
first memory devices; and
a second memory device configured to store device parameters retrieved from a database, wherein the device parameters specifically correspond to the first memory devices.

47. The memory module of claim 46, wherein the first memory devices comprise volatile memory devices.

48. The memory module of claim 46, wherein the second memory device comprises a non-volatile memory device.

49. The memory module of claim 48, wherein the non-volatile memory device comprises a serial presence detect device.

50. The memory module of claim 46, wherein the device parameters comprise specific operating current values of the first memory devices.

51. The memory module of claim 46, wherein the device parameters comprise specific sizes of the first memory devices.

52. The memory module of claim 46, wherein the device parameters comprise specific speeds of the first memory devices.

53. The memory module of claim 46, wherein the device parameters comprise specific operating voltages of the first memory devices.

54. The memory module of claim 46, wherein the device parameters comprise specific timing parameters of the first memory devices.

* * * * *